United States Patent
Kusuda

(10) Patent No.: US 7,072,579 B2
(45) Date of Patent: Jul. 4, 2006

(54) LIGHT IRRADIATION TYPE THERMAL PROCESSING APPARATUS AND METHOD OF ADJUSTING LIGHT IRRADIATION INTENSITY

(75) Inventor: Tatsufumi Kusuda, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 0 days.

(21) Appl. No.: 10/850,632

(22) Filed: May 20, 2004

(65) Prior Publication Data
US 2004/0264950 A1    Dec. 30, 2004

(30) Foreign Application Priority Data
May 21, 2003    (JP) .............................. 2003-143366

(51) Int. Cl.
*F26B 19/00*    (2006.01)
(52) U.S. Cl. ...................... 392/416; 392/411; 219/390; 219/405; 219/411; 118/724; 118/725; 118/50.1
(58) Field of Classification Search ................. 219/390, 219/405, 411; 392/416, 418; 118/724, 725, 118/50.1
See application file for complete search history.

(56) References Cited

U.S. PATENT DOCUMENTS

| | | | |
|---|---|---|---|
| 4,511,788 A * | 4/1985 | Arai et al. ................... | 219/405 |
| 4,571,486 A | 2/1986 | Arai et al. | |
| 4,649,261 A | 3/1987 | Sheets | |
| 5,846,476 A * | 12/1998 | Hwang et al. .............. | 264/493 |
| 5,889,370 A * | 3/1999 | Arai et al. ................... | 315/85 |

FOREIGN PATENT DOCUMENTS

| | | |
|---|---|---|
| JP | 57-162340 | 10/1982 |
| JP | 59-169125 | 9/1984 |
| JP | 60-258928 | 12/1985 |
| JP | 61-198735 | 9/1986 |
| JP | 63-166219 | 7/1988 |
| JP | 2001-237195 | 8/2001 |
| JP | 2001-244212 | 9/2001 |

OTHER PUBLICATIONS

English translation of Abstract of Japanese Patent Application Laid-Open No. 2001-244212.

(Continued)

*Primary Examiner*—Shawntina Fuqua
(74) *Attorney, Agent, or Firm*—Ostrolenk, Faber, Gerb & Soffen, LLP

(57) ABSTRACT

A magnetic ring of ferromagnetic is attached to a wire for supplying electric power to a flash lamp. The magnetic ring is removable and is easily attachable to and detachable from the wire. When turning on the flash lamp, a high electrical current momentarily flows through the wire and intense magnetic fields occur around the wire, so that the magnetic ring attached around the wire is momentarily magnetized. As the result, induced electromotive force is generated and the current momentarily flowing through the wire is weakened, so that the irradiation intensity of the flash lamp is slightly lowered. In contrast, if desired to slightly increase the irradiation intensity of the flash lamp, the magnetic ring may be detached from the wire.

9 Claims, 6 Drawing Sheets

OTHER PUBLICATIONS

English translation of Abstract of Japanese Patent Application Laid-Open No. 59-169125.
English translation of Abstract of Japanese Patent Application Laid-Open No. 63-166219.
English translation of Abstract of Japanese Patent Application Laid-Open No. 2001-237195.
English translation of Abstract of Japanese Patent Application Laid-Open No. 61-198735.
English translation of Abstract of Japanese Patent Application Laid-Open No. 57-162340.
English translation of Abstract of Japanese Patent Application Laid-Open No. 60-258928.

* cited by examiner

LIGHT IRRADIATION TYPE THERMAL PROCESSING APPARATUS AND METHOD OF ADJUSTING LIGHT IRRADIATION INTENSITY

BACKGROUND OF THE INVENTION

1. Field of the Invention

The present invention relates to a thermal processing apparatus that performs thermal processing of a semiconductor wafer and a glass substrate, etc. (hereinafter referred to simply as a "substrate") by irradiating light to the substrate, as well as a method of adjusting irradiation intensity thereof.

2. Description of the Background Art

In an ion activation step of a semiconductor wafer after being subjected to ion implantation, there has heretofore been used a thermal processing apparatus such as a lamp annealing apparatus using halogen lamps. In such a thermal processing apparatus, the ion activation of a semiconductor wafer is carried out by heating (annealing) the semiconductor wafer to temperatures of, for example, approximately 1000° C. to 1100° C. This thermal processing apparatus is constructed so as to elevate the temperature of the substrate at a speed of about several hundreds of degrees per second, by utilizing the energy of light irradiated from the halogen lamps.

The above-mentioned thermal processing apparatus is usually provided with a plurality of lamps and a mechanism for measuring wafer temperatures during processing and performing feedback control of the output to the lamps on the basis of the measurements results. For example, Japanese Patent Application Laid-Open No. 2001-244212 discloses a technique of dividing a plurality of halogen lamps into several zones and performing feedback control of the power of the halogen lamps per zone.

On the other hand, even when the ion activation of a semiconductor wafer is executed with a thermal processing apparatus that elevates the temperature of the semiconductor wafer by halogen lamps at a speed of about several hundreds of degrees per second, the profile of ions implanted into the semiconductor wafer becomes round. That is, it has been found to cause the phenomenon that ions diffuse by heat. In case that this phenomenon occurs, even if ions are implanted at a high concentration into the semiconductor wafer surface, the implanted ions may diffuse. This introduces the problem that it is necessary to implant more ions than necessary.

In order to solve the above problem, for example, Japanese Patent Application Laid-Open Nos. 59-169125 and 63-166219 have proposed such a technique that only the temperature of the surface of a semiconductor wafer after being subjected to ion implantation is elevated in an extremely short period of time (not exceeding several milliseconds) by irradiating flashlight to the surface of the semiconductor wafer by use of xenon flash lamps, etc. For the temperature elevation in a very short time by the xenon flash lamps, the ions will not have a sufficient time to diffuse. Therefore only the ion activation is executable without rounding the profile of ions implanted into the wafer.

A thermal processing apparatus using xenon flash lamps is also provided with a plurality of flash lamps. These flash lamps have an individual difference due to manufacturing error, circuit characteristic error, secular change and the like. Such an individual difference might cause ununiform irradiation intensity, and the output of respective flash lamps needs to be adjusted. However, for flash lamps of which irradiation time is extremely short, it is impossible to perform feedback control of the lamp output on the basis of the measurements results of the temperatures of the semiconductor wafer. This requires that the characteristic of a semiconductor wafer after being subjected to the actual thermal processing be measured and the output of the respective flash lamps be adjusted based on the measurement result.

Unfortunately, it is a considerable increase in cost and hence unrealistic that the voltage at both terminals of the respective flash lamps are adjusted per flash lamp by making changes in the power supply circuit of the flash lamps.

SUMMARY OF THE INVENTION

The present invention is directed to a thermal processing apparatus for heating a substrate by irradiating light to the substrate.

In accordance with the present invention, a thermal processing apparatus includes: a light source having a plurality of lamps; a chamber disposed below the light source; a holding element for holding a substrate in a substantially horizontal position in the chamber; a plurality of wires disposed in one-to-one correspondence to the plurality of lamps in order to supply electric power to their respectively corresponding lamps; and a current adjusting element removably attached to at least a wire of the plurality of wires in order to adjust the current flowing through the wire.

The irradiation intensity of the lamps can be adjusted easily at low cost.

According to one aspect of the present invention, a thermal processing apparatus includes: a light source having a plurality of flash lamps; a chamber disposed below the light source; a holding element for holding a substrate in a substantially horizontal position in the chamber; a plurality of wires disposed in one-to-one correspondence to the plurality of lamps in order to supply electric power to their respectively corresponding flash lamps; and a magnetic ring attached around at least one of the plurality of wires.

The irradiation intensity of the flash lamps can be adjusted easily at low cost.

The present invention is also directed to a method of adjusting the irradiation intensity of a plurality of lamps for heating a substrate by irradiating light to the substrate.

This method includes the step of attaching a magnetic ring around a wire supplying electric power to a lamp having a higher irradiation intensity than other lamps in the plurality of lamps; and the step of performing electric power supply to the plurality of lamps, respectively.

The irradiation intensity of the plurality of lamps can be adjusted easily at low cost.

Accordingly, it is an object of the present invention to provide a thermal processing apparatus and a method with which it is capable of adjusting the irradiation intensity of a lamp with ease and at low cost.

These and other objects, features, aspects and advantages of the present invention will become more apparent from the following detailed description of the present invention when taken in conjunction with the accompanying drawings.

DESCRIPTION OF THE PREFERRED EMBODIMENTS

Preferred embodiments of the present invention are now described in detail by referring to the accompanying drawings.

Figure 1:
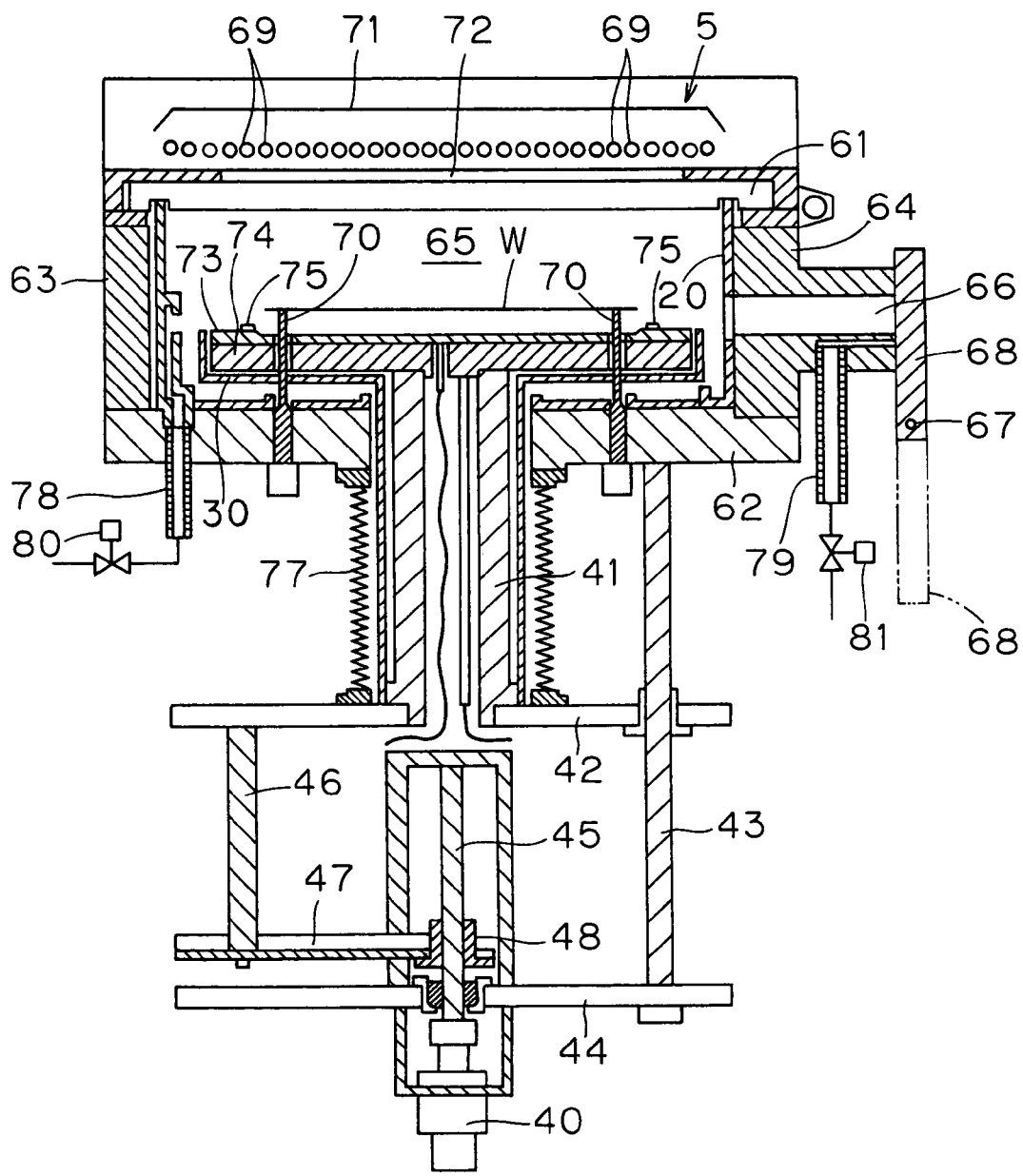
FIG. 1 is a side sectional view showing the construction of a thermal processing apparatus according to the present invention.
Figure 2:
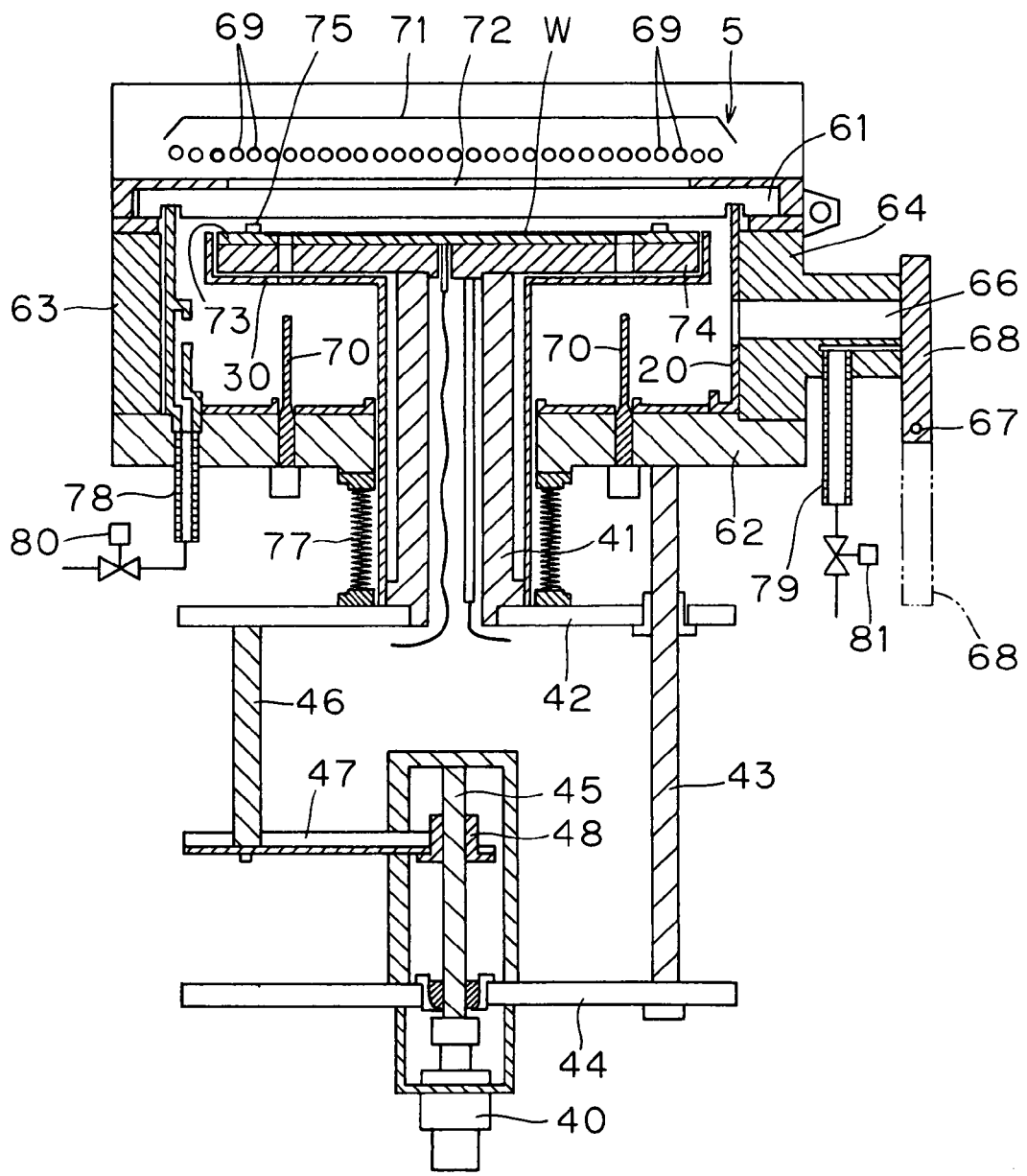
FIG. 2 is another side sectional view showing the construction of the thermal processing apparatus of the present invention.

FIGS. 1 and 2 are side sectional views showing the construction of a thermal processing apparatus according to the present invention. The thermal processing apparatus is an apparatus performing thermal processing of a substrate such as a semiconductor wafer by flashlight from xenon flash lamps.

The thermal processing apparatus comprises a chamber 65 for heat treatment of a semiconductor wafer W stored therein. The chamber 65 is formed by a translucent plate 61, a bottom plate 62, and a pair of side plates 63 and 64. The translucent plate 61 forming an upper part of the chamber 65 is composed of a light-transparent material such as quartz. The translucent plate 61 functions as a chamber window through which the light emitted from a light source 5 is transmitted and introduced into the chamber 65. The bottom plate 62 and the side plates 63 and 64, which form a main body of the chamber 65, are composed of a metal material excellent in strength and heat resistance, such as stainless steel.

Support pins 70 are disposed vertically on the bottom plate 62, which pass through a susceptor 73 to be described later and a heating plate 74 in order to support a semiconductor wafer W from the lower surface thereof. An opening part 66, through which a semiconductor wafer W is loaded and unloaded, is formed in the side plate 64. The opening part 66 can be opened and closed by a gate valve 68 rotating around an axis 67. The semiconductor wafer W is loaded, with the opening part 66 opened, into the chamber 65 by a transport robot (not shown). The gate valve 68 closes the opening part 66 when the semiconductor wafer W is subjected to thermal processing in the chamber 65.

The chamber 65 is disposed under the light source 5. The light source 5 contains a plurality of (thirty pieces in this preferred embodiment) xenon flash lamps 69 (hereinafter referred to simply as "flash lamps 69" in some cases), and a reflector 71. The plurality of flash lamps 69 are bar-like lamps of an elongated cylindrical shape and are arranged in a plane-like and in parallel to one another such that their respective longitudinal directions extend in a horizontal direction. The reflector 71 is disposed above the flash lamps 69 so as to cover all of them.

Each xenon flash lamp 69 has a glass tube filled with xenon gas, both ends of which are respectively provided with an anode and a cathode that are connected to a condenser, and a trigger electrode that is wound around the peripheral part of the glass tube. Xenon gas is electrically insulator and therefore no current flows through the glass tube in the normal state. However, if insulation is broken by applying a high voltage to the trigger electrode, the current stored in the condenser flows momentarily in the glass tube, and Joule heat generated at that time heats the xenon gas thereby to emit light. In the xenon flash lamp 69, electrostatic energy previously stored is converted to extremely short optical pulses of 0.1 milliseconds to 10 milliseconds. Therefore, the flash lamp 69 has a characteristic of being able to irradiate extremely more intense, light than a light source of continuous lighting. In place of the xenon flash lamps 69, flash lamps filled with other rare gas, such as krypton flash lamps, may be used.

A light diffuser 72 is disposed between the light source 5 and the translucent plate 61. The light diffuser 72 is obtained by performing light diffusion processing of the surface of a quartz glass as a light-transparent material.

Part of the light emitted from each flash lamp 69 passes directly through the light diffuser 72 and the translucent plate 61 into the chamber 65. Other part of the light emitted from the flash lamp 69 is first reflected by the reflector 71 and then passes through the light diffuser 72 and the translucent plate 61 into the chamber 65.

A heating plate 74 and the susceptor 73 for holding a semiconductor wafer W are disposed in the chamber 65. The susceptor 73 is disposed on an upper surface of the heating plate 74. A pin 75 for preventing dislocation of a semiconductor wafer W is disposed on the surface of the susceptor 73.

The heating plate 74 is used for preheating (i.e., assist heating) a semiconductor wafer W. The heating plate 74 is made of aluminum nitride and has in its inside a heater and a sensor for controlling the heater. On the other hand, the susceptor 73 is used to preheat uniformly a semiconductor wafer W by diffusing the thermal energy from the heating plate 74. As a material of the susceptor 73, quartz and high purity ceramics and the like are usable. Like the heating plate 74, the susceptor 73 may be formed by aluminum nitride.

It is configured such that a motor 40 drives the susceptor 73 and the heating plate 74 to move up and down between loading and unloading positions of a semiconductor wafer W, as shown in FIG. 1, and a thermal processing position of the semiconductor wafer W, as shown in FIG. 2.

Specifically, the heating plate 74 is connected via a cylindrical body 41 to a movable plate 42. A guide member 43 suspended from the bottom plate 62 of the chamber 65 guides the movable plate 42 so as to be movable up and down. A stationary plate 44 is fixed to a lower end part of the guide member 43, and the motor 40 rotatably driving a ball screw 45 is disposed at a central part of the stationary plate 44. The ball screw 45 is screwed on a nut 48 connected via connecting members 46 and 47 to the movable plate 42. Thus, through the driving of the motor 40, the susceptor 73 and the heating plate 74 can move up and down between the loading and unloading positions shown in FIG. 1, and the thermal processing position shown in FIG. 2.

The loading and unloading positions of a semiconductor wafer W shown in FIG. 1 correspond to a position obtained when the susceptor 73 and the heating plate 74 are lowered in order that a semiconductor wafer W to be loaded through the opening part 66 by the transport robot (not shown) is mounted on the support pins 70 or the semiconductor wafer W mounted on the support pins 70 is unloaded through the opening part 66. In this state, the upper end of the support pins 70 passes through respective through holes formed in the susceptor 73 and the heating plate 74, and then projects upwardly from the surface of the susceptor 73.

On the other hand, the thermal processing position of a semiconductor wafer W shown in FIG. 2 corresponds to a position obtained when the susceptor 73 and the heating plate 74 are raised above the upper end of the support pins 70 in order to perform thermal processing of the semiconductor wafer W. In the process that the susceptor 73 and the heating plate 74 move up from the loading and unloading positions in FIG. 1 to the thermal processing position in FIG. 2, the semiconductor wafer W mounted on the support pins 70 is received by the susceptor 73, and raised with its lower surface supported by the surface of the susceptor 73, and then held in its horizontal position at a location close to the translucent plate 61 in the chamber 65. In contrast, in the process that the susceptor 73 and the heating plate 74 move down from the thermal processing position to the loading and unloading positions, the semiconductor wafer W supported by the susceptor 73 is transferred to the support pins 70.

In a state in which the susceptor 73 and the heating plate 74 that hold the semiconductor wafer W are raised to the thermal processing position, the translucent plate 61 is located between the semiconductor wafer W held by them and the light source 5. Note that the distance between the susceptor 73 and the light source 5 at that time is adjustable to any value by controlling the amount of rotation of the motor 40.

A liner 20 interfits with the chamber wall surface of the chamber 65. The liner 20 is removable instead of being secured to the chamber 65. The liner 20 is, for example, composed of quartz and formed in a cylindrical shape having a bottom so as to cover the inner wall surfaces of the side plates 63, 64 and the bottom plate 62. The liner 20 may be of a divided body that can be divided into a tubular part and a bottom part, or may be formed in a monolithic body.

A heater reflector 30 is disposed, except for the upper surface of the susceptor 73, around the heating plate 74, the susceptor 73, and the cylindrical body 41 supporting them. The heater reflector 30 is also a member made of quartz. The heater reflector 30 prevents that the thermal energy from the heating plate 74 is transmitted to somewhere other than the susceptor 73.

Between the bottom plate 62 of the chamber 65 and the movable plate 42, there is disposed an extensible bellows 77 surrounding the cylindrical body 41 so as to maintain the chamber 65 in an airtight state. The bellows 77 shrinks when the susceptor 73 and the heating plate 74 have been raised to the thermal processing position, and it extends when they have been lowered to the loading and unloading positions, thereby separating the atmosphere of the chamber 65 from the external atmosphere.

An introduction path 78 connected in communication to a switching valve 80 is formed in the side plate 63 that is disposed the opposite side of the opening part 66 in the chamber 65. Through the introduction path 78, gas required for processing such as inactive nitrogen gas is introduced into the chamber 65. A discharge path 79 connected in communication to a switching valve 81 is formed in the opening part 66 of the side plate 64. The discharge path 79 is used to exhaust the gas in the chamber 65 and connected via the switching valve 81 to an exhaust means (not shown).

Figure 3:
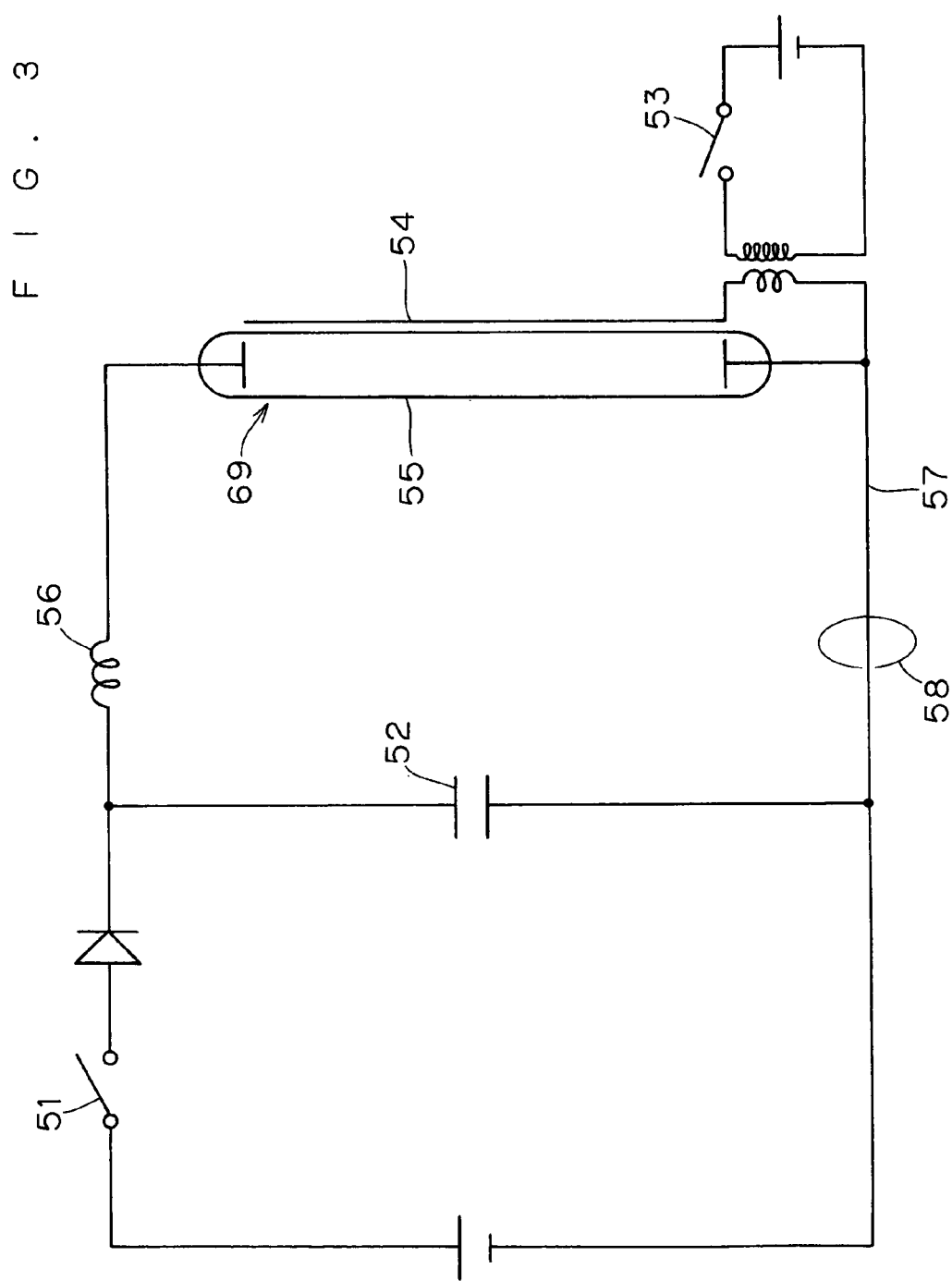
FIG. 3 is a diagram showing a power supply circuit for supplying electric power to flash lamps.

The thermal processing apparatus is also provided with a power supply circuit for supplying electric power to the respective flash lamps 69. FIG. 3 is a diagram showing the power supply circuit for supplying electric power to the flash lamps 69. When a charge switch 51 is in its ON state, electric charge is stored in a condenser 52. In accordance with the amount of electric charge stored in the condenser 52, a voltage is applied to the electrodes on both terminals of the flash lamps 69. It should be noted that since xenon gas filled in the inside of the flash lamps 69 is an insulator, no current flows within a glass tube 55 even if a high voltage is applied to the electrodes of both terminals.

In a state in which a high voltage is applied to the electrodes of both terminals of the flash lamps 69, when the insulation is broken by placing a trigger switch 53 in its ON state and applying a high voltage to a trigger electrode 54, the electric charge stored in the condenser 52 flows instantaneously in the glass tube 55, and Joule heat generated at that time heats the xenon gas thereby to emit light. The waveform of current flowing at this time is substantially determined by the inductance of a coil 56. This power supply circuit is disposed in each of the flash lamps 69, whereas the trigger switch 53 may be common to a plurality of power supply circuits.

Figure 4:
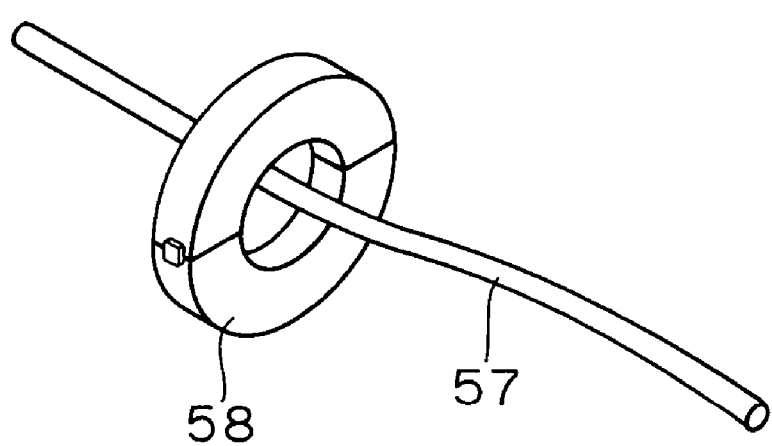
FIG. 4 is a perspective view showing a state in which a magnetic ring is attached to a wire.

In this preferred embodiment, a magnetic ring 58 is attached to a wire 57 for supplying electric power to the flash lamps 69. FIG. 4 is a perspective view showing a state in which the magnetic ring 58 is attached to the wire 57. FIG. 5 is a sectional view of the magnetic ring 58. The magnetic ring 58 is constructed by hinging a first member 58a and a second member 58b, each having a semicircular shape, such that they can be opened and closed. The first and second members 58a and 58b are composed of plastic, for example. Engaging members 59a and 59b are disposed on the opposite side from a hinging portion of the magnetic ring 58. The engaging member 59a is secured to the first member 58a, and the engaging member 59b is secured to the second member 58b.

The first member 58a contains a ferrite core 60a of a semicircular shape extending along the shape of the first member 58a. Likewise, the second member 58b contains a ferrite core 60b of a semicircular shape extending along the shape of the second member 58b. The ferrite cores 60a and 60b are ferromagnetic.

Figure 5A:
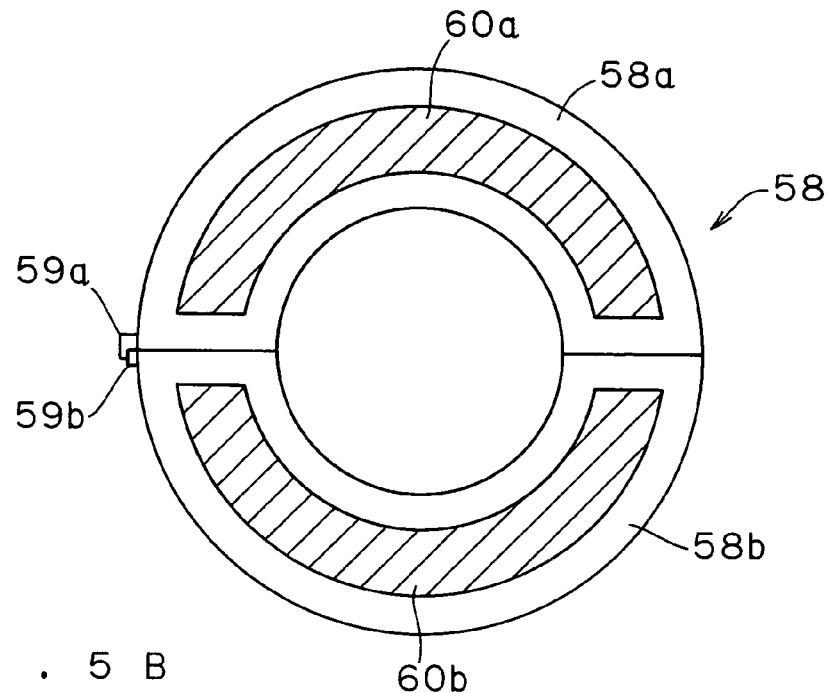
FIGS. 5A and 5B are sectional views of the magnetic ring.
Figure 5B:
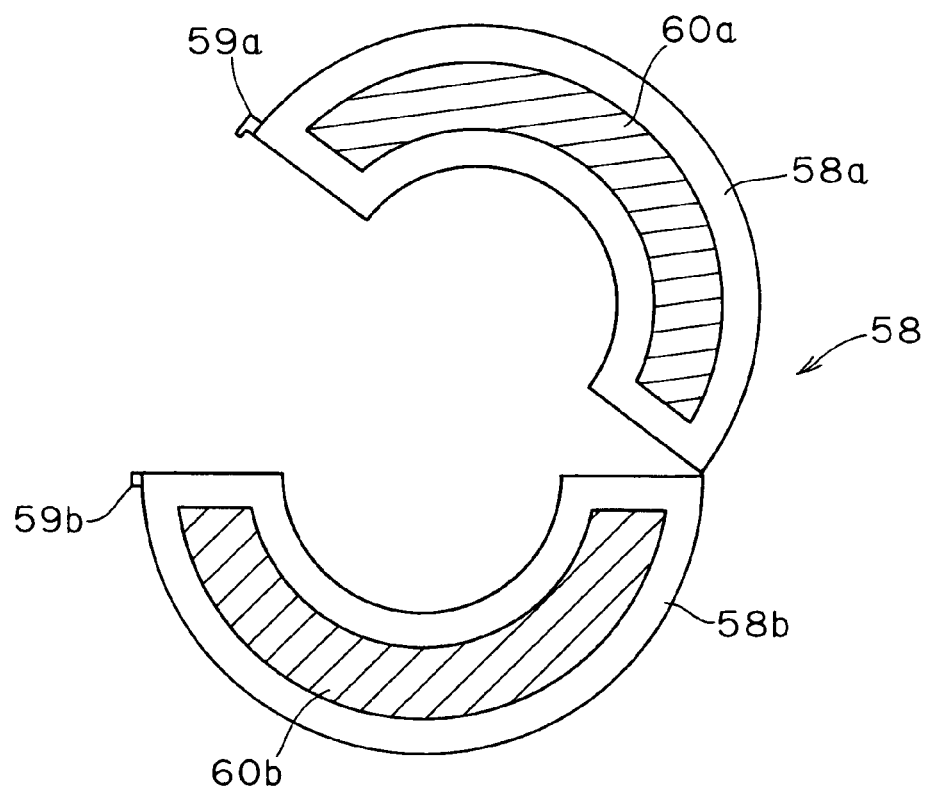

By closing the first member 58a and the second member 58b to engage both of the engaging members 59a and 59b, the first and second members 58a and 58b are secured to be in a closed state and serve as the annular-shaped magnetic ring 58 (i.e., the state shown in FIG. 5A). On the other hand, the first and second members 58a and 58b can easily be set to their open state only by releasing the engaging state of the engaging members 59a and 59b (i.e., the state shown in FIG. 5B). Therefore, the magnetic ring 58 can be attached to the wire 57 only by closing the first and second members 58a and 58b with the wire 57 interposed therebetween, and engaging the engaging members 59a and 59b. The magnetic ring 58 is easily detachable from the wire 57 only by releasing the engaging state of the engaging members 59a and 59b from the state in which the magnetic ring 58 is attached to the wire 57. That is, the magnetic ring 58 is removably disposed around the wire 57, so that an operator can easily attach and detach the magnetic ring 58 with respect to the wire 57 for supplying electric power to the flash lamps 69. The wire 57 is disposed in one-to-one correspondence to thirty flash lamps 69, and the magnetic ring 58 is removable relative to each of the thirty wires 57.

The following is a thermal processing operation of a semiconductor wafer W in the thermal processing apparatus having the above-mentioned construction. The semiconductor wafer W that is a processing object of this thermal processing apparatus is a semiconductor wafer after being subjected to ion implantation.

In this thermal processing apparatus, in a state in which the susceptor 73 and the heating plate 74 are in the loading and unloading positions of a semiconductor wafer W shown in FIG. 1, the semiconductor wafer W is loaded through the opening part 66 by a transport robot (not shown) and then mounted on the support pins 70. At the completion of the loading of the semiconductor wafer W, the gate valve 68 closes the opening part 66. Thereafter, the motor 40 drives the suscepter 73 and the heating plate 74 to move up to the thermal processing position of a semiconductor wafer W shown in FIG. 2, so as to hold the semiconductor wafer W in its horizontal position. Also, the switching valves 80 and 81 are opened to form a gas flow of nitrogen gas in the chamber 65.

The suscepter 73 and the heating plate 74 are preheated to a predetermined temperature by the action of the heater contained in the heating plate 74. Therefore, when the suscepter 73 and the heating plate 74 are in the thermal processing position of the semiconductor wafer W, the semiconductor wafer W is preheated by making contact with the suscepter 73 in its preheated state, so that the temperature of the semiconductor wafer W increases gradually.

In this state, the semiconductor wafer W is continuously heated through the suscepter 73. During the time that the temperature of the semiconductor wafer W is increasing, a temperature sensor (not shown) provided in the heating plate 74 always monitors whether or not the inside temperature of the heating plate 74 reaches such a setting temperature that the surface temperature of the semiconductor wafer W reaches a preheating temperature T1.

The preheating temperature T1 is, for example, about 200° C. to about 600° C., preferably about 350° C. to about 550° C. Even when the semiconductor wafer W is heated to the preheating temperature T1 in this temperature range, the ions implanted into the semiconductor wafer W do not diffuse.

Then, when the surface temperature of the semiconductor wafer W reaches the preheating temperature T1, the flash lamps 69 is turned on to perform flash heating. The lighting time of the flash lamps 69 in the flash heating step is about 0.1 milliseconds to about 10 milliseconds. Thus, extremely intense flashlight can be irradiated because the static energy previously stored is converted to such extremely short optical pulses in the flash lamps 69.

The surface temperature of the semiconductor wafer W momentarily reaches temperature T2 by the flash heating. The temperature T2 is about 1000° C. to about 1100° C., which is required for ion activation processing of the semiconductor wafer W. The temperature of the surface of the semiconductor wafer W is elevated to the processing temperature T2, thereby activating the ions implanted into the semiconductor wafer W.

At this time, the surface temperature of the semiconductor wafer W is elevated to the processing temperature T2 in an extremely short time of about 0.1 milliseconds to about 10 milliseconds, thereby completing the activation of the ions in the semiconductor wafer W in a short period of time. Therefore, the ions implanted into the semiconductor wafer W do not diffuse, thereby avoiding the phenomenon that the profile of the ions implanted into the semiconductor wafer W becomes round. Note that since the time required for ion implantation is extremely shorter than the time required for ion diffusion, the ion activation is completed even in such a short period of time, about 0.1 milliseconds to about 10 milliseconds, which is too short to cause diffusion.

Before the flash lamps 69 is turned on to heat the semiconductor wafer W, the surface temperature of the semiconductor wafer W is already heated to the preheating temperature T1 of about 200° C. to about 600° C., by use of the heating plate 74. It is therefore possible to quickly elevate the semiconductor wafer W to the processing temperature T2 of about 1000° C. to about 1100° C., by use of the flash lamps 69.

After the flash heating step is terminated, the motor 40 drives the suscepter 73 and the heating plate 74 to move down to the loading and unloading positions of the semiconductor wafer W shown in FIG. 1. At the same time the opening part 66 that has been closed by the gate valve 68 is opened. The semiconductor wafer W mounted on the support pins 70 is taken out by the transport robot (not shown). Thus, a sequence of the thermal processing operation is completed.

In the meantime, the thirty xenon flash lamps 69 are disposed in the light source 5 in this preferred embodiment. As previously described, these flash lamps have an individual difference due to manufacturing error, circuit characteristic error, secular change and the like. In the presence of such an individual difference, the distribution of irradiation intensity can be ununiform, so that the characteristic of the processed semiconductor wafer W causes in-plane ununiformity. For example, if only a certain flash lamp 69 has a higher irradiation intensity than others, only the temperature of a section of a semiconductor wafer W located immediately below this flash lamp 69 is increased, and in-plane ununiformity occurs in the characteristic of the processed semiconductor wafer W. In an apparatus using the flash lamps 69, it is impossible to make a real time measurement of the temperature of a semiconductor wafer W during processing because the irradiation time is extremely short. Therefore, an individual difference between the flash lamps 69 is not found out until the measurement of the sheet resistance value and the like of the processed semiconductor wafer W.

As described above, in the cases where only a certain flash lamp 69 has a higher irradiation intensity than others, an operator attaches the magnetic ring 58 to the wire 57 for supplying electric power to this flash lamp 69. This is a very simple operation of merely interposing the wire 57 between the first and second members 58a and 58b, and engaging the engaging members 59a and 59b. Thereby, the magnetic ring 58 is attached around the wire 57, as shown in FIG. 4.

When the flash lamps are turned on to perform flash heating, for example, current as high as about 4000A flows through the wire 57 in about one millisecond. Under such a high current flow, intense magnetic fields are generated around the wire 57 according to Ampere's law. As a result, the magnetic ring 58 (specifically the ferrite cores 60a and 60b of ferromagnetic contained in the magnetic ring 58) attached to the wire 57 is momentarily magnetized.

If the magnetic ring 58 is momentarily magnetized, induced electromotive force is generated in the wire 57 by electromagnetic induction action. The induced electromotive force generated at this time occurs in such a direction as to flow induced current in the direction to disturb a magnetic flux change occurred in the magnetic ring 58 (Lenz's law). That is, the induced electromotive force occurs so as to flow the induced current in the opposite direction to the current flowing from the condenser 52 to the flash lamps 69. As a result, the waveform of the current flowing from the condenser 52 to the flash lamps 69 changes so as to be shifted somewhat smoothly.

Figure 6:
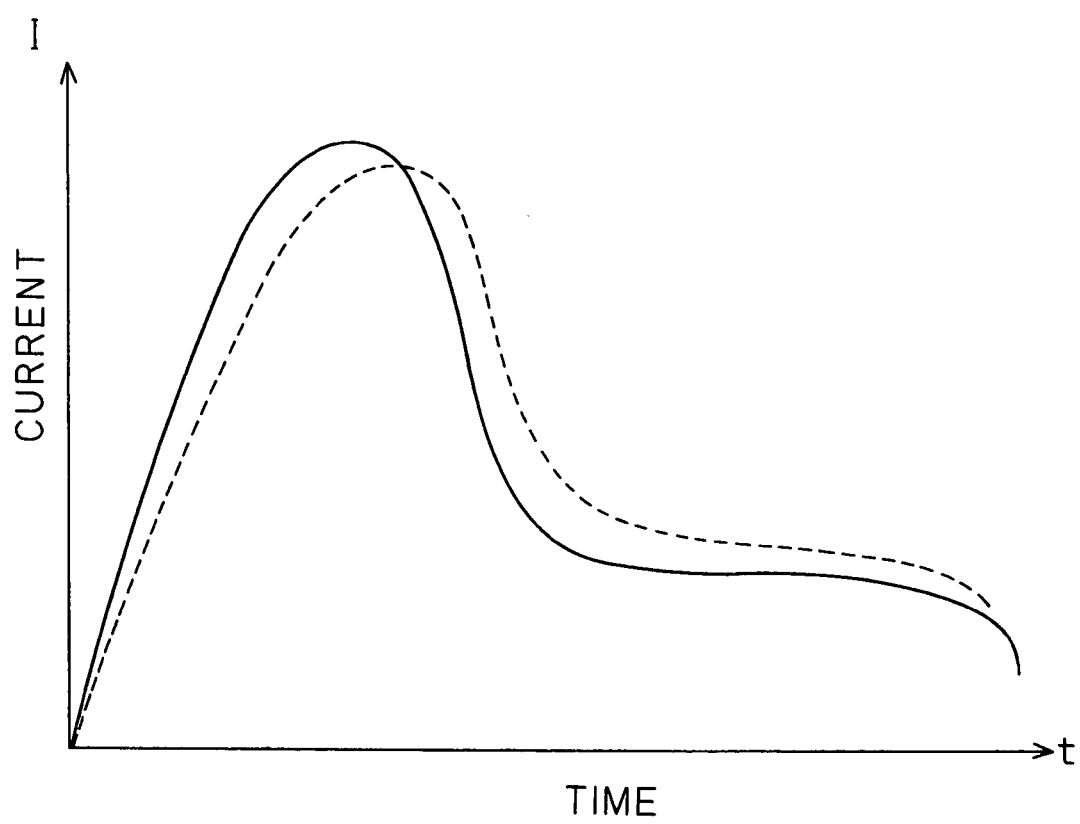
FIG. 6 is a diagram showing changes in the waveform of current flowing through a flash lamp by the presence of the magnetic ring.

FIG. 6 is a diagram showing changes in the waveform of current flowing through the flash lamps 69 by the presence of the magnetic ring 58. In FIG. 6, the abscissa represents an elapsed time from a moment that the insulation within the flash lamps 69 is broken, and the ordinate represents the amount of current flowing within the flash lamps 69. The current waveform in a normal state in which the magnetic ring 58 is not attached around the wire 57 is as indicated by the solid line in FIG. 6. In contrast, when the magnetic ring 58 is attached around the wire 57, the current waveform changes as indicated by the dotted line in FIG. 6, because of the induced electromotive force resulting from the magnetization of the magnetic ring 58. That is, the current that flows momentarily is slightly reduced. As the result, the current that flows momentarily in the flash lamp 69 having a higher irradiation intensity than others is slightly reduced and its irradiation intensity is slightly weakened, so that the luminance distribution of the light source 5 as a whole becomes uniform. Thereby, the in-plane temperature distribution of a semiconductor wafer W during flash heating becomes uniform, so that the in-plane distribution of the characteristic after processing is also uniform.

As discussed above, in this preferred embodiment the irradiation intensity of the flash lamps 69 is adjusted by a simple operation of merely attaching the magnetic ring 58 to the wire 57. The cost required for this is extremely lower than the case of adjusting the power supply circuit of the flash lamps 69, and the time required is also extremely shorter than that case. That is, in accordance with this preferred embodiment, an operator is capable of adjusting the irradiation intensity of the flash lamps 69 with considerably ease and at low cost.

While the preferred embodiment of the present invention has been described, this preferred embodiment is illustrative and should not be viewed as limiting the present invention. For example, although in the foregoing preferred embodiment, the light source 5 is provided with the thirty flash lamps 69, without limiting to this, the number of flash lamps 69 may be determined at will.

Although the foregoing preferred embodiment describes the case of decreasing the irradiation intensity of the flash lamp 69 having a higher irradiation intensity than others, it is also possible to increase the irradiation intensity of a flash lamp 69 having a lower irradiation intensity than others. In preparation for such a case, a single magnetic ring 58 is previously attached to all of the thirty wires 57 for supplying electric power to the thirty flash lamps 69. If only a certain flash lamp 69 has a lower irradiation intensity than others, an operator detaches the magnetic ring 58 from the wire 57 for supplying electric power to that flash lamp 69. By doing so, the current flowing in that flash lamp 69 is slightly increased by the reverse action of that described above, and that flash lamp 69 has a slightly increased irradiation intensity. If desired to decrease the irradiation intensity of the flash lamp 69, an additional magnetic ring 58 may be attached to the wire 57.

In an alternative, a plurality of magnetic rings 58 may be attached to a single wire 57 depending on the degree of the individual difference of the flash lamp 69, or a magnetic ring 58 may be attached to a plurality of wires 57. In another alternative, the same plural magnetic rings 58 are attached to all of the wires 57, and the number of the magnetic rings 58 may be increased or decreased from the respective wires 57 in accordance with the degree of the individual difference of the flash lamp 69. By any of these adjusting operations, it is very easy to attach and detach the magnetic ring 58 with respect to the wire 57, thus enabling to adjust the irradiation intensity of the flash lamp 69 with ease and at low cost. Although the variations in irradiation intensity that can be adjusted by a single magnetic ring 58 is small, even such a simple adjustment is sufficient because the individual difference of the flash lamp 69 due to secular change or the like is originally slight.

The technique of the present invention is also applicable to such a thermal processing apparatus that in place of the flash lamps 69, other type of lamps (e.g., halogen lamps) are disposed in the light source 5, and a semiconductor wafer W is heated by the light irradiation from these lamps. Even for this case, if light is generated by having current that has alternating current characteristic pass through the lamps, the irradiation intensity of the lamps can be adjusted easily at low cost by attaching or detaching the magnetic ring 58 with respect to the wire 57, as in the foregoing preferred embodiment.

Although in the foregoing preferred embodiment the ion activation processing is executed by irradiating light to a semiconductor wafer, a substrate to be processed by the thermal processing apparatus of the present invention is not limited to a semiconductor wafer. For example, the processing with use of the thermal processing apparatus of the present invention may be executed to a glass substrate in which a variety of silicon films such as a silicon nitride film and a polycrystal silicon film are formed. As an example, to a polycrystal silicon film that is formed on a glass substrate by CVD method, ion implantation of silicon is performed to form an amorphous silicon film that is made into amorphous, and a silicon oxide film serving as an antireflection film is formed on the amorphous silicon film. In this state, the thermal processing apparatus of the present invention may perform light irradiation to the entire surface of the amorphous silicon film, thereby forming a polycrystal silicon film that is derived from the polycrystallization of the amorphous silicon film.

In an alternative, to a TFT substrate, which is obtained by the step of forming on a glass substrate an underlayer silicon oxide film and a polysilicon film derived from the crystallization of amorphous silicon, and the step of doping impurities such as phosphor or boron into the polysilicon film, the thermal processing apparatus of the present invention may perform light irradiation to activate the impurities implanted in the doping step.

While the invention has been shown and described in detail, the foregoing description is in all aspects illustrative and not restrictive. It is therefore understood that numerous modifications and variations can be devised without departing from the scope of the invention.

What is claimed is:

1. A thermal processing apparatus for heating a substrate by irradiating light to said substrate, comprising:
   a light source having a plurality of lamps;
   a chamber disposed below said light source;
   a holding element for holding a substrate in a substantially horizontal position in said chamber;
   a plurality of wires disposed in a one-to-one correspondence to said plurality of lamps in order to supply electric power to their respectively corresponding lamps; and
   a magnetic ring removably attached around at least one wire of said plurality of wires in order to weaken the irradiation intensity of a lamp connected to said one wire by adjusting the current flowing in said one wire.

2. The thermal processing apparatus according to claim 1 wherein
   said magnetic ring contains a ferrite core.

3. A thermal processing apparatus for heating a substrate by irradiating flashlight to said substrate, comprising:
- a light source having a plurality of flash lamps;
- a chamber disposed below said light source;
- a holding element for holding a substrate in a substantially horizontal position in said chamber;
- a plurality of wires disposed in one-to-one correspondence to said plurality of flash lamps in order to supply electric power to their respectively corresponding flash lamps; and
- a magnetic ring removably attached around at least one wire of said plurality of wires in order to weaken the irradiation intensity of a flash lamp connected to said one wire.

4. The thermal processing apparatus according to claim 3 wherein
said magnetic ring contains a ferrite core.

5. A method of adjusting the irradiation intensity of a plurality of lamps for heating a substrate by irradiating light to said substrate, comprising the steps of:
- attaching a magnetic ring removably around a wire supplying electric power to a lamp having a higher irradiation intensity than other lamps in said plurality of lamps;
- providing electric power supply to said plurality of lamps, respectively; and
- weakening the irradiation intensity of said lamp having a higher irradiation intensity and connected to said wire by attaching said magnetic ring around said wire.

6. The method according to claim 5 wherein
said magnetic ring contains a ferrite core.

7. The method according to claim 6 wherein
each of said plurality of lamps is a flash lamp.

8. The method according to claim 5 further comprising the step of:
- detaching a magnetic ring from the surroundings of a wire supplying electric power to a lamp having a lower irradiation intensity than other lamps in said plurality of lamps.

9. The method according to claim 5 wherein
said magnetic ring is attached around said wire in order to weaken the irradiation intensity of said lamp by smoothing the waveform of current flowing in said wire.

* * * * *